United States Patent [19]

DeGuelle

[11] Patent Number: 5,216,354
[45] Date of Patent: Jun. 1, 1993

[54] CONTROLLABLE VOLTAGE-TO-CURRENT CONVERTER HAVING THIRD-ORDER DISTORTION REDUCTION

[75] Inventor: Wilhelmus H. G. DeGuelle, Eindhoven, Netherlands

[73] Assignee: U.S. Philips Corp., New York, N.Y.

[21] Appl. No.: 845,401

[22] Filed: Mar. 4, 1992

[30] Foreign Application Priority Data

Mar. 6, 1991 [NL] Netherlands ............ 9100398

[51] Int. Cl.$^5$ .................................. G05F 3/08
[52] U.S. Cl. .................................. 323/312; 363/73
[58] Field of Search ............... 323/312, 313, 314; 363/73

[56] References Cited

U.S. PATENT DOCUMENTS

| | | | |
|---|---|---|---|
| 3,213,299 | 10/1965 | Rogers | 307/578 |
| 3,444,397 | 5/1969 | Lym | 307/302 |
| 3,512,012 | 5/1970 | Kosowsky et al. | 307/510 |
| 3,813,595 | 5/1974 | Sheng | 323/312 |
| 3,823,332 | 7/1974 | Feryszka et al. | 323/313 |
| 4,357,571 | 11/1982 | Roessler | 323/313 |
| 4,395,643 | 7/1983 | Lehmann | 307/264 |
| 4,633,164 | 12/1986 | Kaiser | 323/312 |
| 4,710,726 | 12/1987 | Czarnul | 330/69 |
| 4,952,866 | 8/1990 | Van Tuijl | 323/312 |
| 5,081,371 | 1/1992 | Wong | 323/314 |
| 5,142,219 | 8/1992 | Hsu et al. | 323/314 |

OTHER PUBLICATIONS

Telecommunications and Radio Engineering, vol. 38/39, No. 12, Dec. 1984 "Correction of the Transfer Function of a Power Fet-Based Attenuator".

*Primary Examiner*—Steven L. Stephan
*Assistant Examiner*—J. Sterrett
*Attorney, Agent, or Firm*—Steven R. Biren

[57] ABSTRACT

A voltage-to-current converter in MOS technology includes a signal resistor formed by a channel of a MOS signal transistor (11, 12, 13, 14) with a source electrode and a drain electrode which form terminals of the channel. A gate electrode is provided for connecting a gate voltage ($V_g$) for adjusting the resistance of the channel and a bulk electrode is provided for connecting a bulk voltage ($V_b$), and a supply is provided for supplying source, drain, gate and bulk voltages to the electrodes, for non-saturated operation of the signal transistor. The supply includes control circuitry (30) for controlling the bulk voltage in response to the gate voltage. Consequently, the third-order distortion of the voltage-to-current converter is reduced.

5 Claims, 6 Drawing Sheets

CONTROLLABLE VOLTAGE-TO-CURRENT CONVERTER HAVING THIRD-ORDER DISTORTION REDUCTION

BACKGROUND OF THE INVENTION

The invention relates to a voltage-to-current converter comprising a signal resistor formed by a channel of a signal transistor of the field effect type with a source electrode and a drain electrode which form terminals of the channel, and with a set of two adjusting electrodes constituted by first and second adjusting electrodes, one of the two adjusting electrodes being a gate electrode for the purpose of connecting a gate voltage to adjust the channel resistance and the other one of the set of adjusting electrodes being a bulk electrode for the purpose of connecting a bulk voltage, supply means for supplying a source voltage, a drain voltage, first and second adjusting voltages to the source electrode, the drain electrode, the first and second adjusting electrodes respectively, for non-saturated operation of the signal transistor.

A voltage-to-current converter of this type is known, for example, from the article entitled "Fully Integrated Active RC Filters in MOS Technology", IEEE Journal of Solid-State Circuits, Vol. SC-18, No. 6, December 1983, pp. 644-651. Voltage-to-current converters of this type convert a signal voltage to a signal current. In integrated circuits field-effect transistors are used as resistors while the channel of a non-saturated field-effect transistor operating in the triode region operates as a resistor and the signal voltage is applied to the channel. The channel resistance is brought to a desired value by means of the gate voltage.

The channel resistance of such a field-effect transistor is rather non-linear and causes non-linear signal distortion. The second-order distortion is eliminated by using the voltage-to-current converters in a balanced manner. All even-harmonic distortion components are then cancelled. However, the odd-harmonic components continue to be present and limit the dynamic range of the voltage-to-current converter.

SUMMARY OF THE INVENTION

It is an object of the invention to provide a voltage-to-current converter which has an enlarged dynamic range. A voltage-to-current converter according to the invention of the type mentioned in the opening paragraph is thereto characterized in that the supply means comprise control means for controlling the first adjusting voltage as a function of the second adjusting voltage, the first adjusting voltage being unequal to the second adjusting voltage.

The invention is based on the implementation of an improved computation model for the channel resistance of the field-effect transistor in which the mobility modulation of the channel charge carriers, which modulation is caused by the field perpendicular to the direction of the current of charge carriers, is taken into consideration. This computation model and measuring results prove that the third-harmonic distortion may be reduced considerably if the bulk voltage for the signal transistor is derived from the gate voltage of this transistor or, conversely, the gate voltage is derived from the bulk voltage. Due to the reduction of the third-harmonic distortion, the voltage-to-current converter may be driven to a wider extent before a specific distortion limit is reached.

A first embodiment of a voltage-to-current converter according to the invention is characterized in that the control means comprise a reference voltage source for producing a reference voltage and a summing amplifier which amplifier has an output coupled to the first adjusting electrode of the signal transistor for a voltage to be supplied in response to the sum of the second adjusting voltage multiplied by a predetermined factor and the reference voltage. This establishes a linear relation between the bulk and gate voltages, so that a good approximation is obtained of the relation that results from the improved computation model.

A second embodiment of a voltage-to-current converter according to the invention is characterized in that the control means comprise:

a measuring resistor formed by the channel of a measuring transistor having similar properties and electrodes to those of the signal transistor, the first adjusting electrode of the measuring transistor being connected to the first adjusting electrode of the signal transistor, a measuring signal source for generating a sinusoidal signal, of which an output is coupled to the channel of the measuring transistor so as to cause an essentially sinusoidal channel current to flow through the channel, distortion measuring means for generating a control voltage that is a measure for the third-order distortion of the channel current, means for supplying the control voltage to the second adjusting electrodes of the measuring transistor and the signal transistor. During this operation the bulk voltage or the gate voltage is adaptively determined by constantly measuring the third-order distortion of the channel current in the measuring transistor and adjusting the bulk voltage or the gate voltage to the measured distortion. As a result, tolerances in the properties of the applied field-effect transistors no longer have any substantial effect on the third-harmonic distortion reduction.

A further embodiment of a voltage-to-current converter according to the invention is characterized in that the measuring signal source is arranged as a fourfold, i.e. first, second, third and fourth, measuring signal source for generating sinusoidal first, second, third and fourth measuring signals having a first frequency and having amplitudes which exhibit a ratio of 2:1:1:2, and having phases which are mutually opposite as regards the second and third measuring signals and as regards the first and fourth measuring signals, in that the measuring resistor is arranged as a sixfold, i.e. first to sixth, measuring transistor, these transistors all having similar properties and electrodes to the signal transistor, the respective first and second adjusting electrodes being connected to the corresponding electrodes of the signal transistor and the drain electrode of the first measuring transistor being connected to an output of the first measuring signal source, the drain electrodes of the second and third measuring transistors to an output of the second measuring signal source, the drain electrode of the fourth and fifth measuring transistors to an output of the third measuring signal source and the drain electrode of the sixth measuring transistor being connected to the output of the fourth measuring signal source, in that the distortion measuring means comprise:

a balanced amplifier having inverting and non-inverting outputs for supplying a balanced output signal, and an inverting input connected to the source electrodes of the first, fourth and fifth measuring transistors, and a non-inverting input connected to the source electrodes of the second, third and sixth measuring transistors, a fifth measuring signal source for generating a mixing signal having a second frequency which is three times as large as the first frequency, a synchronous detector having inputs for receiving the balanced output signal and the mixing signal and having an output for supplying a detected signal, and a low-pass filter for filtering the detected voltage and producing the control voltage.

The balanced output signal of the balanced amplifier comprises substantially only third-harmonic components of the sinusoidal measuring signal, which components are effectively measured by means of the low-pass filter and the synchronous detector which operates at the triple frequency.

A further embodiment of a voltage-to-current converter according to the invention is characterized in that the measuring signal source is arranged as a dual source comprising first and second measuring signal sources for generating sinusoidal measuring signals which have a first frequency, mutually equal amplitudes and opposite phases, in that the measuring resistor is arranged as a dual resistor constituted by first and second measuring transistors, both having similar properties and electrodes to the signal transistor, the respective first and second adjusting electrodes being connected to the corresponding electrodes of the signal transistor and the drain electrode of the first measuring transistor being connected to an output of the first measuring signal source and the drain electrode of the second measuring transistor being connected to an output of the second measuring signal source, in that the distortion measuring means comprise:

a balanced amplifier having inverting and non-inverting outputs for producing first and second output signals respectively, and having an inverting input connected to the source electrode of the first measuring transistor and having a non-inverting input connected to the source electrode of the second measuring transistor, first and second feedback transistors both having similar properties and electrodes to those of the first and second measuring transistors, the respective first and second adjusting electrodes being connected to the corresponding electrodes of the signal transistor and the channel of the first feedback transistor being connected between the non-inverting input and the inverting output of the balanced amplifier and the channel of the second feedback transistor being connected between the inverting input and the non-inverting output of the balanced amplifier, first and second summing means for summing the first measuring signal and the first output signal to a first sum signal and for summing the second measuring signal and the second output signal to a second sum signal, a fifth measuring signal source for generating a mixing signal which has a second frequency which is three times as large as the first frequency, a synchronous detector having an input for receiving the first and second sum signals and an input for receiving the mixing signal and having an output for supplying a detected signal, and a low-pass filter for filtering the detected voltage and producing the control voltage.

This embodiment operates in similar fashion. However, this embodiment requires no more than two measuring signals.

BRIEF DESCRIPTION OF THE DRAWING

The invention will now be further explained with reference to the appended drawing Figures, in which.

In these drawing Figures like components having identical functions or connotations have like reference numerals.

DESCRIPTION OF THE PREFERRED EMBODIMENTS

Figure 1:
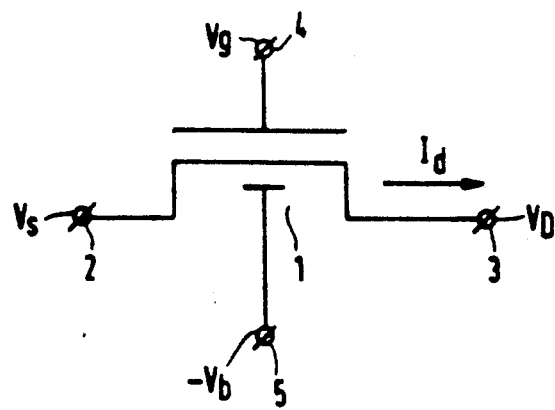
FIG. 1 shows a MOS transistor comprising connecting electrodes.

FIG. 1 shows a field-effect transistor 1 comprising a source electrode 2, a drain electrode 3, a gate electrode 4 and a bulk electrode 5 on which the respective voltages $V_s$, $V_d$, $V_g$, and $-V_b$ are present, which voltages are all defined relative to an arbitrary reference voltage. A channel current or drain current $I_d$ flows through the channel of the transistor 1. It is assumed that the voltages are selected so that the field-effect transistor is in non-saturation. The relation between the channel current $I_d$ and the voltages applied to the electrodes of the field-effect transistor 1 may be described as:

$$I_d = \frac{\beta W}{2L} \frac{2(V_g - V_{t0} + K\sqrt{2\phi})(V_d - V_s) - V_d^2 + V_s^2 - \frac{4}{3} K\{(V_b + V_d + 2\phi)^{\frac{3}{2}} - (V_b + V_s + 2\phi)^{\frac{3}{2}}\}}{1 + \theta(V_g - V_{t0} - (V_d + V_s)/2)} \quad (1)$$

where:
$\beta$ = conductivity constant
W = width of the channel
L = length of the channel
$V_g$ = gate voltage $V_d$ = drain voltage
$V_s$ = source voltage
$V_b$ = bulk voltage
$V_{to}$ = threshold voltage
$K$ = substrate factor
$\phi$ = surface potential
$\theta$ = mobility modulation factor To simplify equation (1), the voltage $V_s$ is assumed to be equal to zero. Equation (1) then becomes:

$$I_d = \frac{\beta W}{2L} \frac{2(V_g - V_{to} + K\sqrt{2\phi})V_d - V_d^2 - \frac{4}{3}K\{(V_b + V_d + 2\phi)^{\frac{3}{2}} - (V_b + 2\phi)^{\frac{3}{2}}\}}{1 + \theta(V_g - V_{to} - V_d/2)} \quad (2)$$

Equation (2) may be expanded into a Taylor series of the type:

The even order terms may be removed by balancing. As a result, the distortion due to $$I_d = \frac{\beta W}{2L}(C_1 \cdot V_d + C_2 \cdot V_d^2 + C_3 \cdot V_d^3) \quad (3)$$

the third-order term is dominating in the total distortion of the channel current $I_d$. By differentiating $I_d$ to $V_d$ three times in equation (2) and then equalling $V_d$ to zero, there may be computed how large $C_3$ is. For $C_3$ then holds:

$$C_3 = \frac{K}{12(V_b + 2\phi)^{\frac{3}{2}}} - \frac{\theta}{2(1 + \theta(V_g - V_{to}))} \quad (4)$$

$C_3$ comprises two terms of opposite signs, so that it is possible for these terms to cancel each other out. By equalling $C_3$ in equation (4) to zero, the relation between $V_b$ and $V_g$ may be determined. Then:

$$V_b = -2\phi + \left(\frac{K}{6\theta}\right)^{\frac{2}{3}} \cdot (1 + \theta(V_g - V_{to}))^{\frac{2}{3}} \quad (5)$$

In practice $\theta$ is much smaller than 1, so that the first two terms of a Taylor series may form a good approximation to equation (5). Equation (5) is then changed into:

$$V_b = -2\phi + \left(\frac{K}{6\theta}\right)^{\frac{2}{3}} \cdot (1 - V_{to}) + \quad (6)$$

$$\left(\frac{K}{6}\right)^{\frac{2}{3}} \cdot \frac{2}{3} \theta^{\frac{1}{3}} V_g = V_{ref} + A \cdot V_g$$

Figure 2A:
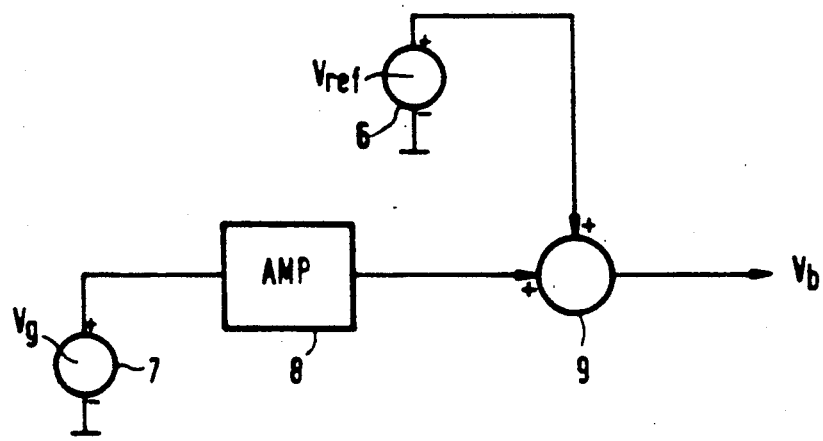
FIG. 2a gives a diagrammatic representation of a non-adaptive bulk voltage source to be used in a voltage-to-current converter according to the invention, FIG. 2b gives a diagrammatic representation of a non-adaptive gate voltage source to be used in a voltage-to-current converter according to the invention.
Figure 2B:
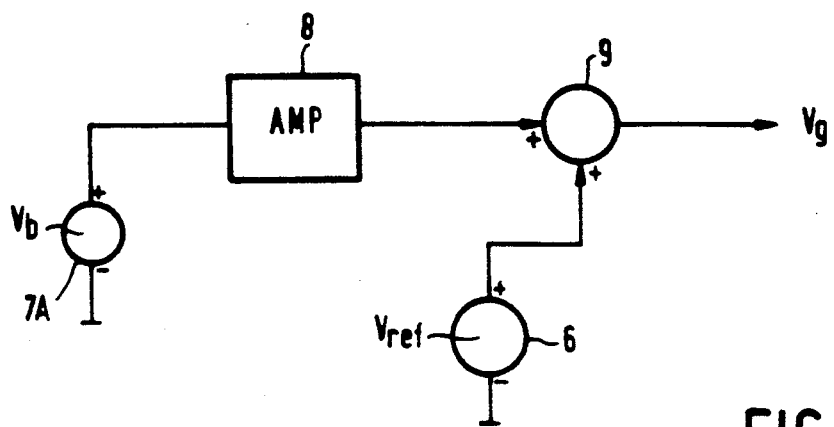

There is now a linear relation between the bulk voltage $V_b$ and the gate voltage $V_g$ which is represented diagrammatically in FIG. 2, where in FIG. 2a the bulk voltage $V_b$ is derived from the gate voltage $V_g$. The reverse is alternatively possible as is shown in FIG. 2b, where the gate voltage $V_g$ is derived from the bulk voltage $V_b$. FIG. 2a shows a reference voltage source 6 carrying voltage $V_{ref}$ and a gate voltage source 7 carrying voltage $V_g$, which is amplified by a factor A in an amplifier 8. The voltages are added together in an adder stage 9 which produces the bulk voltage $V_b$. FIG. 2b shows an identical reference voltage source 6 carrying voltage $V_{ref}$ and a bulk voltage source 7A carrying voltage $V_b$, which is amplified by a factor A in an amplifier 8. The voltages are added together in an adder stage 9 which produces the gate voltage $V_g$. The voltage $V_{ref}$ and the factor A result from equation (6) and depend on the parameters of the field-effect transistors used.

Figure 3:
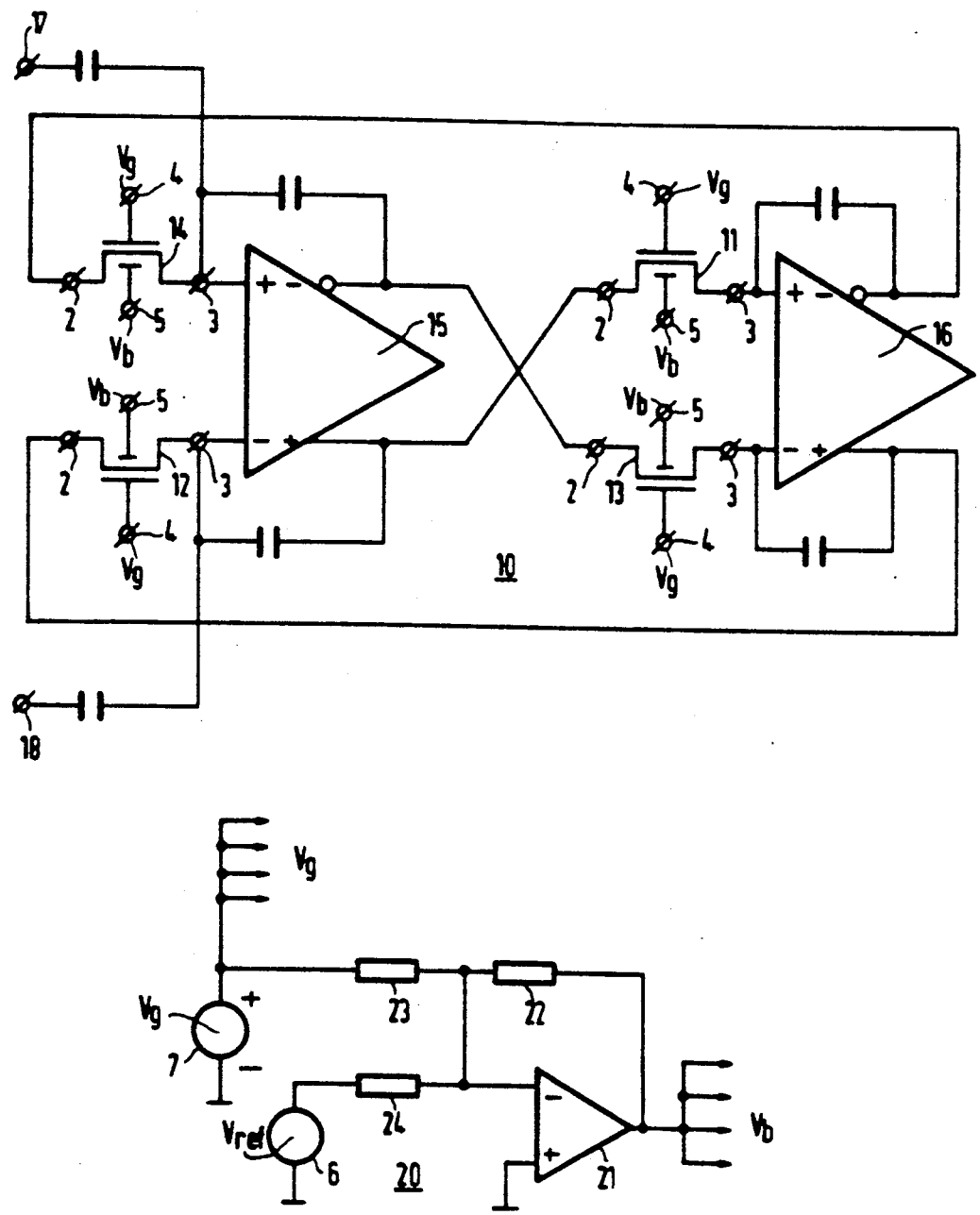
FIG. 3 shows an embodiment of a voltage-to-current converter according to the invention, FIG. 4a gives a diagrammatic representation of an adaptive bulk voltage source to be used in a voltage-to-current converter according to the invention, FIG. 4b gives a diagrammatic representation of an adaptive gate voltage source to be used in a voltage-to-current converter according to the invention.

Therefore, it is possible with a relatively extremely simple circuit to derive a bulk voltage $V_b$ from the gate voltage $V_g$ or, conversely, a gate voltage $V_g$ from the bulk voltage $V_b$, so that a good third-harmonic distortion in the voltage-to-current converter is obtained. FIG. 3 represents a filter circuit 10 comprising four voltage-to-current converters 11, 12, 13 and 14 which have each a field-effect transistor that includes electrodes as shown in FIG. 1. By way of example a resonance circuit is selected, but this is not essential. The filter circuit in this embodiment comprises two cascaded balanced integrators 15 and 16 in which the voltage-to-current converters 11-14 operate as signal resistors in series with the inputs of the integrators 15 and 16. The resistance of the voltage-to-current converters 11-14 can be adjusted with the gate voltage $V_g$ of the gate voltage source 7 which is connected to the gate electrode 4 of each of the voltage-to-current converters. A signal to be filtered may be applied to input terminals 17 and 18 of the filter circuit 10.

For the third-order-harmonic distortion cancellation the circuit further includes a bulk voltage generator 20 which generates a bulk voltage $V_b$ which linearly depends on the gate voltage $V_g$. The bulk voltage generator 20 comprises an operational amplifier 21 which has inverting and non-inverting inputs and an output. The output has feedback to the inverting input by way of a resistor 22. The non-inverting input is connected to earth. The gate voltage source 7 and the reference voltage source 6 are connected to the inverting input of the operational amplifier 21 by way of resistors 23 and 24 respectively. The output of the operational amplifier 21 produces a bulk voltage $V_b$, whose magnitude is determined by the reference voltage $V_{ref}$ and the ratios of the resistances of the resistors 18, 19 and 20. The bulk voltage $V_b$ is connected to the bulk electrode 5 of each of the voltage-to-current converters 11-14.

Cancellation of the third-harmonic distortion of the circuit shown in FIG. 3 is not adaptive. This is to say that the factor A which the circuit represents according to equation (6) and according to the diagram of FIG. 2, has fixed value. The cancellation will be sub-optimum when, as a result of tolerances and the like, the values of the parameters of the field-effect transistors in the voltage-to-current converters 11-14 differ from the values at which the bulk voltage generator 20 is dimensioned. Deriving the bulk voltage $V_b$ from the gate voltage $V_g$ or, conversely, the gate voltage $V_g$ from the bulk voltage $V_b$, may also be effected adaptively. This is to say that the factor A for the adjustment between the bulk voltage $V_b$ and the gate voltage $V_g$ is made dependent on the values of the transistor parameters.

Figure 4A:
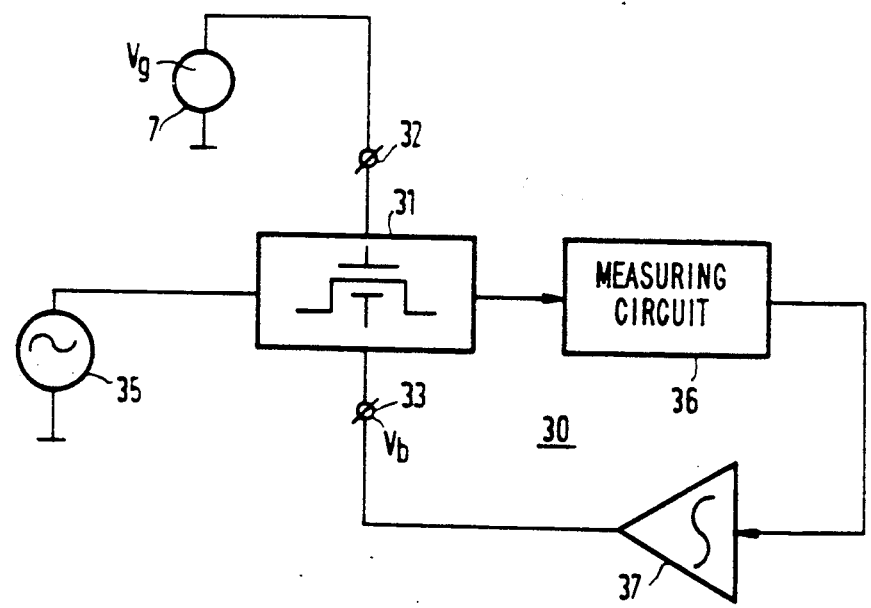
Figure 4B:
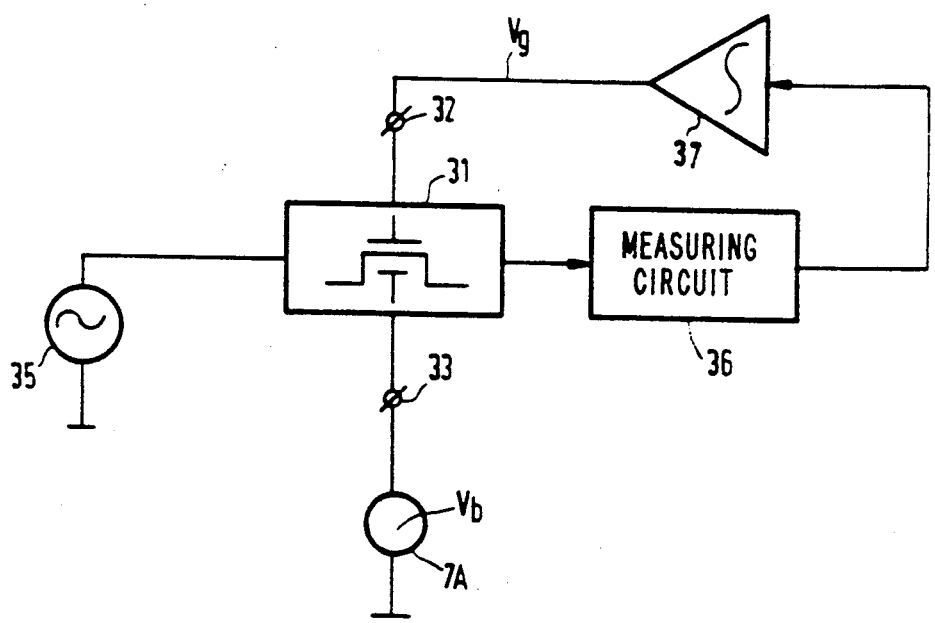

FIG. 4a shows the block diagram of an adaptive bulk voltage generator 30. This generator comprises a measuring transistor 31 arranged as a measuring resistor, whose gate electrode 32 is connected to the gate voltage source 7. A measuring signal source 35 having a sinusoidal signal is connected to the channel of the measuring transistor 31. The third-order distortion in the channel current is measured by a measuring circuit 36 which generates an output voltage that is proportional to the third-order component in the channel current. This voltage is integrated in an integrator 37 and converted to a bulk voltage $V_b$ applied to the bulk electrode 33 of the measuring transistor 31. The system will constantly adjust the bulk voltage $V_b$ in such a way that the third-order distortion in the channel current of the measuring transistor 31 is cancelled. Conversely, when the bulk voltage $V_b$ is predetermined, the bulk voltage source 7A is connected to the bulk electrode 33 and the output of the integrator 37 is connected to the gate electrode 32 as is shown in FIG. 4b.

Figure 5:
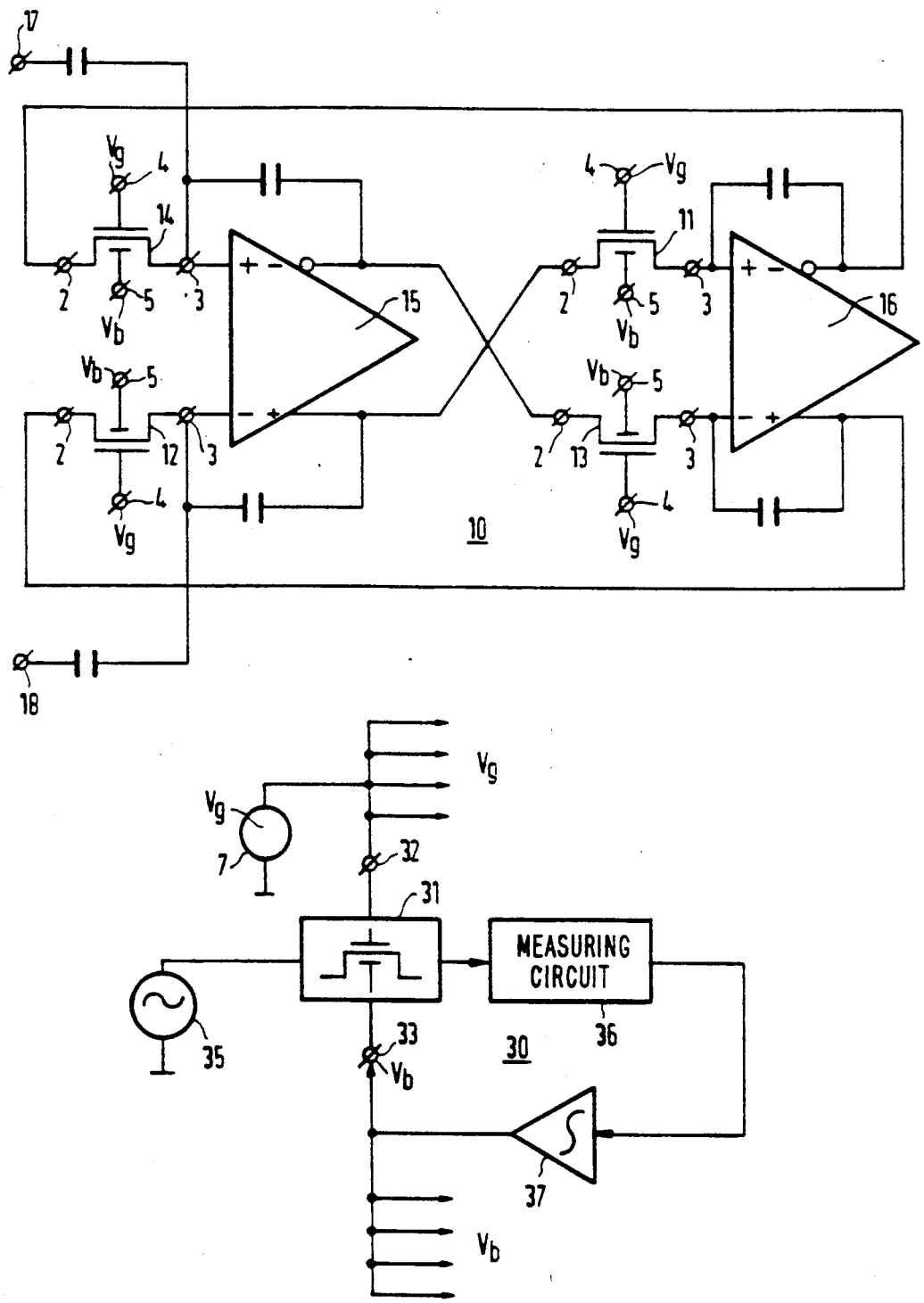
FIG. 5 shows an embodiment of a voltage-to-current converter according to the invention.

FIG. 5 shows the same filter circuit 10 as that of FIG. 3, but now comprising an adaptive bulk voltage generator 30 as shown in FIG. 4. The gate electrode 4 of each of the voltage-to-current converters 11-14 as well as the gate electrode 32 of the measuring transistor 31 are all connected to the gate voltage source 7. The bulk electrode 5 of each of the voltage-to-current converters 11-14 as well as the bulk electrode 33 of the measuring transistor 31 are all connected to the bulk voltage $V_b$. The measuring transistor 31 is of the same type as the transistors in the voltage-to-current converters 11-14. The distortion measured in the measuring transistor is therefore representative of the distortion to be expected in the filter circuit 10.

Figure 6:
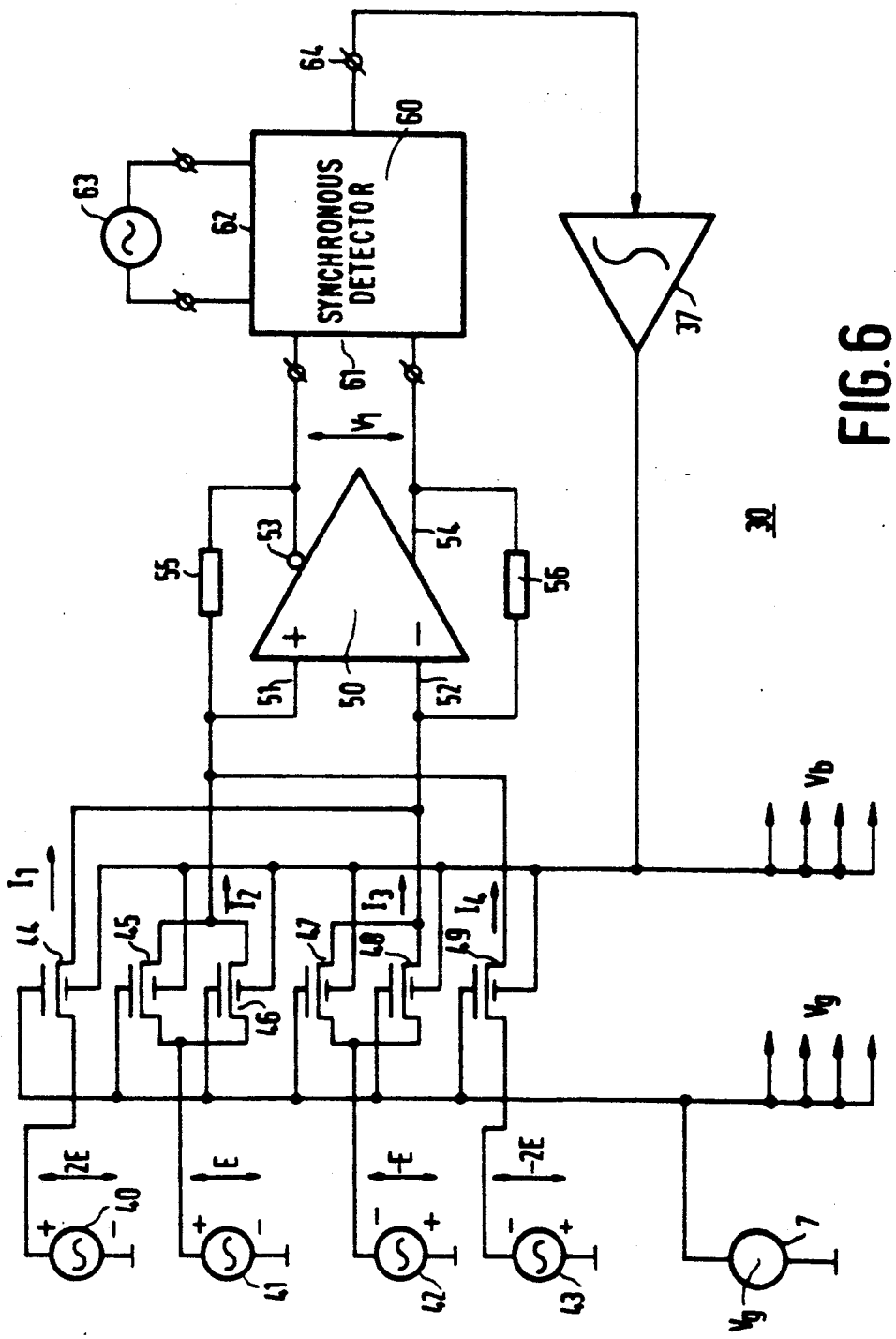
FIG. 6 shows an embodiment of a voltage-to-current converter according to the invention.

FIG. 6 shows a first embodiment of an adaptive bulk voltage generator 30. There are four measuring signal sources 40, 41, 42 and 43 producing a sinusoidal signal with a first frequency and with amplitudes which are 2E, E, −E and −2E respectively. The bulk voltage generator 30 further includes a balanced amplifier 50 which has a non-inverting input 51, an inverting input 52, an inverting output 53 and a non-inverting output 54, which are fed back to the non-inverting input 51 and the inverting input 52 respectively, by way of respective resistors 55 and 56 having a value R. Furthermore, a synchronous detector 60 is included which has an input 61 connected to the outputs 53 and 54 of the balanced amplifier 50, an input 62 to which a fifth measuring signal source 63 is connected and an output 64 which is connected to the integrator 37. The fifth measuring signal generator 63 produces a signal with a second frequency which is three times as large as the first frequency of the four measuring signal sources 40-43. The bulk voltage generator further includes six measuring transistors 44, 45, 46, 47, 48 and 49 of a type identical with the transistors in the voltage-to-current converters 11-14 of the filter circuit 10. The gate electrodes of the six measuring transistors are all connected to the gate voltage source 7 which also supplies the gate electrodes of the voltage-to-current converters 11-14 in the filter circuit 10 with a voltage. The bulk electrodes of the six measuring transistors together with the bulk electrodes of the voltage-to-current converters 11-14 of the filter circuit 10 are connected to the output of the integrator 37 which produces the bulk voltage $V_b$. The channel of measuring transistor 44 is connected between the measuring signal source 40 and the inverting input 52 and the current flowing through this channel is $I_1$. The channels of the measuring transistors 45 and 46 are both connected between the measuring signal source 41 and the non-inverting input 51 and the total current flowing through these channels is $I_2$. The channels of the measuring transistors 47 and 48 are both connected between the measuring signal source 42 and the inverting input 52 and the total current flowing through these channels is $I_3$. The channel of measuring transistor 49 is connected between the measuring signal source 43 and the non-inverting input 51 and the current flowing through this channel is $I_4$. Each of the currents $I_1$-$I_4$ may be described as is done in equation (3):

$$I_1 = \frac{\beta W}{2L} \cdot (C_1 \cdot 2E + C_2 \cdot 4E^2 + C_3 \cdot 8E^3) \quad (7)$$

$$I_2 = \frac{\beta W}{2L} \cdot 2(C_1 \cdot E + C_2 \cdot E^2 + C_3 \cdot E^3) \quad (8)$$

$$I_3 = \frac{\beta W}{2L} \cdot 2(-C_1 \cdot E + C_2 \cdot E^2 + C_3 \cdot E^3) \quad (9)$$

$$I_4 = \frac{\beta W}{2L} \cdot (-C_1 \cdot 2E + C_2 \cdot 4E^2 + C_3 \cdot 8E^3) \quad (10)$$

For the voltage difference $V_1$ at the outputs 53 and 54 of the balanced amplifier 50 we now find:

$$V_1 = (I_1 - I_2 + I_3 - I_4) \cdot R \quad (11)$$

Substitution of the equations (7) to (10) in equation (11) provides:

$$V_1 = R \cdot \frac{\beta W}{2L} \cdot C_3 \cdot 12E^3 \quad (12)$$

The voltage $V_1$ includes only a sinusoidal third-order term having a frequency which is three times as large as the frequency of the signals of the measuring signal sources 40-43. The fifth measuring signal at input 62 of the synchronous detector also has a frequency which is three times as large. At output 64 of the synchronous detector 60 a DC mixing signal is developed which, after being integrated by the integrator 37, may be used as the bulk voltage $V_b$.

Figure 7:
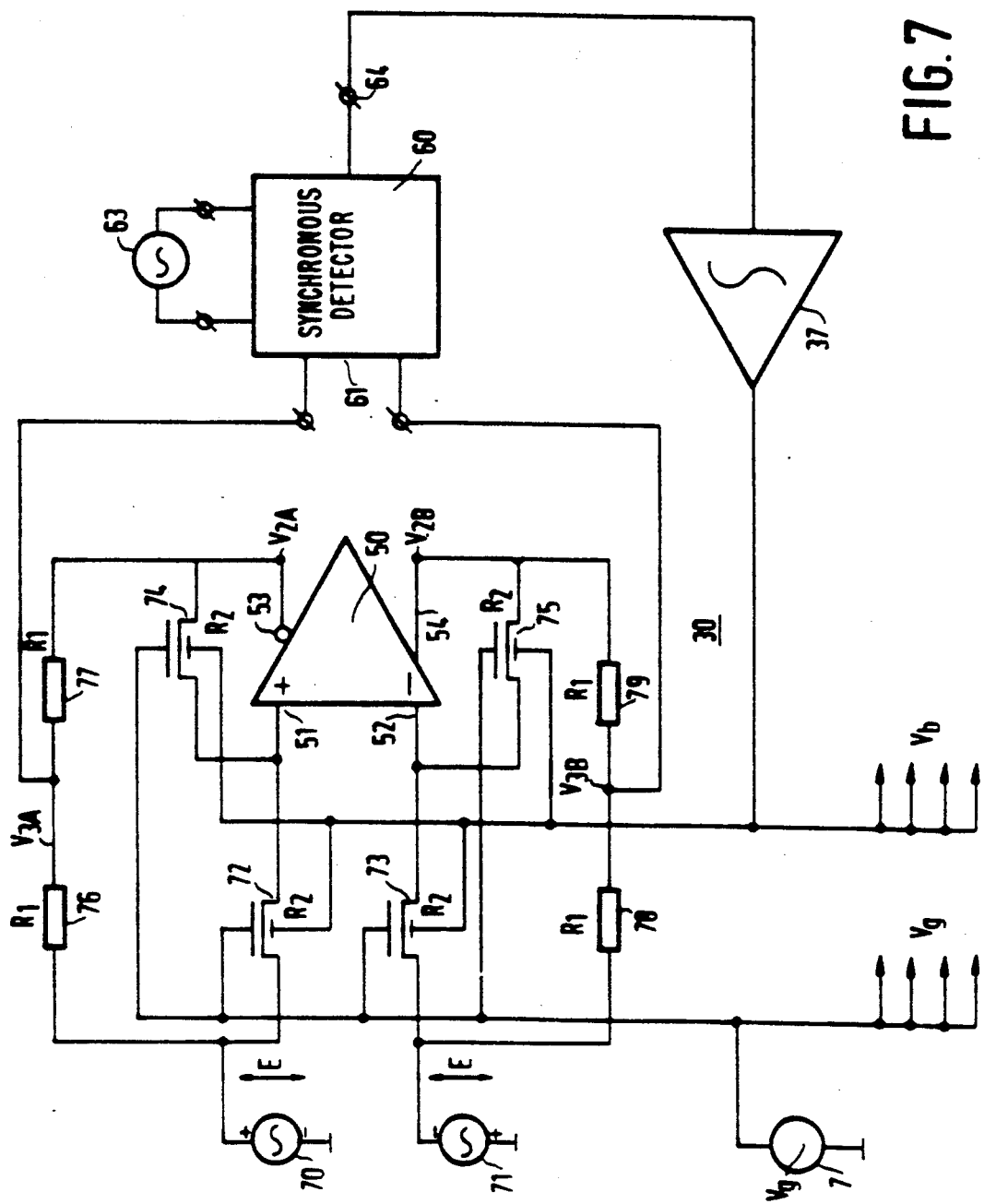
FIG. 7 shows an embodiment of a voltage-to-current converter according to the invention.

FIG. 7 shows a second embodiment of an adaptive bulk voltage generator 30. There are two measuring signal sources 70 and 71 which produce equally large but opposite sinusoidal signals E and −E respectively having a first frequency. The measuring signal source 70 is connected to the non-inverting input 51 of a balanced amplifier 50 through the channel of a first measuring transistor 72, which amplifier is similar to the balanced amplifier 50 shown in FIG. 6. The outputs 53 and 54 are fed back to the respective inputs 51 and 52 by way of the channels of the feedback transistors 74 and 75 respectively. Output 53 produces a first output signal $V_{2A}$, the output 54 an opposite second output signal $V_{2B}$. The gate electrodes of the measuring transistors 72 and 73 as well as the feedback transistors 74 and 75 are all connected to the gate voltage source 7 which also supplies the gate electrodes of the voltage-to-current converters 11-14 in the filter circuit 10 with a voltage. The bulk electrodes of the measuring transistors 72 and 73 and of the feedback transistors 74 and 75, together with the bulk electrodes of the voltage-to-current converters 11-14 of the filter circuit 10, are connected to the output of the integrator 37 which produces the bulk voltage $V_b$. The measuring transistors and the feedback transistors are all of the same type as the transistors in the voltage-to-current converters 11-14 in the filter circuit 10. A series combination of two resistors 76 and 77 having resistance $R_1$ is inserted between the first measuring signal source 70 and the inverting output 53.

A signal $V_{3A}$ which is the sum of the measuring signal E of measuring signal source 70 and the first output signal $V_{2A}$ is available at the junction of the resistors 76 and 77. A series combination of two resistors 78 and 79 having resistance $R_1$ is likewise inserted between the second measuring signal source 71 and the non-inverting output 54. A signal $V_{3B}$ which is the sum of the measuring signal $-E$ of measuring signal source 71 and the first output signal $V_{2B}$ is available at the junction of the resistors 78 and 79. The resistance of the transistors 72–75 is $R_2$. Now the following relations hold:

$$V_{2A} = -E + \delta \qquad (13)$$

In this equation $\delta$ represents the distortion component.

$$V_{3A} = \frac{E + V_{2A}}{2} \qquad (14)$$

Substitution of equation (13) in (14) provides:

$$V_{3A} = \frac{\delta}{2} \qquad (15)$$

The voltage $V_{3B}$ is the opposite to the voltage $V_{3A}$ so that only the distortion component $\delta$ is present at input 61, which component is again converted to a bulk voltage $V_b$ by the synchronous detector 60 and the integrator 37 in a manner described hereinbefore.

The invention is not restricted to third-order distortion reduction in the four voltage-to-current converters 11–14 of the filter circuit 10. The adaptive and non-adaptive bulk or gate voltage generators shown may be used in any field-effect transistor circuit comprising one or more voltage-to-current converters of the type as shown in the embodiments of the filter in the drawing Figures.

I claim:

1. Voltage-to-current converter comprising a signal resistor formed by a channel of a signal transistor of the field effect type with a source electrode and a drain electrode which form terminals of the channel, and with a set of two adjusting electrodes constituted by first and second adjusting electrodes, one of the two adjusting electrodes being a gate electrode for the purpose of connecting a gate voltage to adjust the channel resistance and the other one of the set of adjusting electrodes being a bulk electrode for the purpose of connecting a bulk voltage, supply means for supplying a source voltage, a drain voltage, first and second adjusting voltages to the source electrode, the drain electrode, the first and second adjusting electrodes respectively, for non-saturated operation of the signal transistor, characterized in that the supply means comprise control means for controlling the first adjusting voltage as a function of the second adjusting voltage, the first adjusting voltage being unequal to the second adjusting voltage.

2. Voltage-to-current converter as claimed in claim 1, characterized in that the control means comprise a reference voltage source for producing a reference voltage and a summing amplifier which amplifier has an output coupled to the first adjusting electrode of the signal transistor for a voltage to be supplied in response to the sum of the second adjusting voltage multiplied by a predetermined factor and the reference voltage.

3. Voltage-to-current converter as claimed in claim 1, characterized in that the control means comprise:

a measuring resistor formed by the channel of a measuring transistor having similar properties and electrodes to those of the signal transistor, the first adjusting electrode of the measuring transistor being connected to the first adjusting electrode of the signal transistor, a measuring signal source for generating a sinusoidal signal, of which an output is coupled to the channel of the measuring transistor so as to cause an essentially sinusoidal channel current to flow through the channel, distortion measuring means for generating a control voltage that is a measure for the third-order distortion of the channel current, and means for supplying the control voltage to the second adjusting electrodes of the measuring transistor and the signal transistor.

4. Voltage-to-current converter as claimed in claim 3, characterized in that the measuring signal source is arranged as a fourfold, measuring signal source for generating sinusoidal first, second, third and fourth measuring signals having a first frequency and having amplitudes which exhibit a ratio of 2:1:1:2, and having phases which are mutually opposite as regards the second and third measuring signals and as regards the first and fourth measuring signals, in that the measuring resistor is arranged as a sixfold, measuring transistor, these transistors all having similar properties and electrodes to the signal transistor, the respective first and second adjusting electrodes being connected to the corresponding electrodes of the signal transistor and the drain electrode of the first measuring transistor being connected to an output of the first measuring signal source, the drain electrodes of the second and third measuring transistors to an output of the second measuring signal source, the drain electrode of the fourth and fifth measuring transistors to an output of the third measuring signal source and the drain electrode of the sixth measuring transistor being connected to the output of the fourth measuring signal source, in that the distortion measuring means comprise:

a balanced amplifier having inverting and non-inverting outputs for supplying a balanced output signal, and an inverting input connected to the source electrodes of the first, fourth and fifth measuring transistors, and a non-inverting input connected to the source electrodes of the second, third and sixth measuring transistors, a fifth measuring signal source for generating a mixing signal having a second frequency which is three times as large as the first frequency, a synchronous detector having inputs for receiving the balanced output signal and the mixing signal and having an output for supplying a detected signal, and a low-pass filter for filtering the detected voltage and producing the control voltage.

5. Voltage-to-current converter as claimed in claim 3, characterized in that the measuring signal source is arranged as a dual source comprising first and second measuring signal sources for generating sinusoidal measuring signals which have a first frequency, mutually equal amplitudes and opposite phases, in that the measuring resistor is arranged as a dual resistor constituted by first and second measuring transistors, both having similar properties and electrodes to the signal transistor, the respective first and second adjusting electrodes being connected to the corresponding electrodes of the signal transistor and the drain electrode of the first measuring transistor being connected to an output of the first measuring signal source and the drain electrode of the second measuring transistor being connected to an output of the second measuring signal source, in that the distortion measuring means comprise:

a balanced amplifier having inverting and non-inverting outputs for producing first and second output signals respectively, and having an inverting input connected to the source electrode of the first measuring transistor and having a non-inverting input connected to the source electrode of the second measuring transistor, first and second feedback transistors both having similar properties and electrodes to those of the first and second measuring transistors, the respective first and second adjusting electrodes being connected to the corresponding electrodes of the signal transistor and the channel of the first feedback transistor being connected between the non-inverting input and the inverting output of the balanced amplifier and the channel of the second feedback transistor being connected between the inverting input and the non-inverting output of the balanced amplifier, first and second summing means for summing the first measuring signal and the first output signal to a first sum signal and for summing the second measuring signal and the second output signal to a second sum signal, a fifth measuring signal source for generating a mixing signal which has a second frequency which is three times as large as the first frequency, a synchronous detector having an input for receiving the first and second sum signals and an input for receiving the mixing signal and having an output for supplying a detected signal, and a low-pass filter for filtering the detected voltage and producing the control voltage.

* * * * *